(12) United States Patent
Mangano et al.

(10) Patent No.: US 6,798,797 B2
(45) Date of Patent: Sep. 28, 2004

(54) METHOD AND APPARATUS FOR DRIVING LASER DIODE SOURCES

(75) Inventors: Joseph Mangano, Boca Raton, FL (US); Rodney A. Petr, Acton, MA (US)

(73) Assignee: Science Research Laboratory, Inc., Somerville, MA (US)

( * ) Notice: Subject to any disclaimer, the term of this patent is extended or adjusted under 35 U.S.C. 154(b) by 0 days.

(21) Appl. No.: 10/165,195

(22) Filed: Jun. 7, 2002

(65) Prior Publication Data

US 2003/0039280 A1 Feb. 27, 2003

Related U.S. Application Data

(60) Provisional application No. 60/297,114, filed on Jun. 7, 2001.

(51) Int. Cl.$^7$ .............................. H01S 3/13; H01S 3/00
(52) U.S. Cl. ................................... 372/29.01; 372/38.1
(58) Field of Search ........................ 372/29.01, 29.011, 372/29.012, 29.015, 29.12, 38.02, 38.3, 38.34, 38.35

(56) References Cited

U.S. PATENT DOCUMENTS

| 4,410,810 | A | * | 10/1983 | Christen | 327/375 |
| 4,586,118 | A | * | 4/1986 | Mihalka | 363/17 |
| 5,194,803 | A | * | 3/1993 | Visser et al. | 323/360 |
| 5,852,358 | A | * | 12/1998 | Ehsani | 323/240 |
| 6,057,673 | A | * | 5/2000 | Okayama | 323/207 |
| 6,249,417 | B1 | * | 6/2001 | Pippen | 361/139 |
| 6,259,714 | B1 | * | 7/2001 | Kinbara | 372/38.02 |

* cited by examiner

Primary Examiner—Don Wong
Assistant Examiner—Phillip Nguyen
(74) Attorney, Agent, or Firm—Wolf, Greenfield & Sacks, P.C.

(57) ABSTRACT

A method and apparatus for driving a laser diode source, such as a laser diode or a laser diode array. The driver controlling current in response to a signal indicative of excessive current or current density. The signal may be derived from the drive current, the voltage across the laser diode source or the impedance of the laser diode source. The circuit may be pulsed using a switch, such as a GCT. The current to generate drive the laser diode source provided by a capacitive or inductive charging circuit.

30 Claims, 9 Drawing Sheets

METHOD AND APPARATUS FOR DRIVING LASER DIODE SOURCES

RELATED INVENTIONS

This invention claims priority under 35 U.S.C. § 119(e) to United States provisional application 60/297,114 to Mangano et al., filed Jun. 7, 2001, entitled, "Method and Apparatus for Driving High Power Laser Diode Array," the subject matter of which is hereby incorporated by reference.

BACKGROUND OF THE INVENTION

1. Field of the Invention

This invention relates to driver circuits for laser diodes, and more particularly to high-speed, power conditioning driver circuits for laser diodes and laser diode arrays.

2. Background

Laser diodes are continually finding new applications in the commercial, military, medical and other sectors. Laser diodes span the optical spectrum from the near infra-red (IR) through the visible wavelengths, which allows them to be used in a variety of applications, including, inter alia, optical communications, laser pointing and tracking, machining and welding, and pumping of a variety of optically-pumped lasers. Current technology trends all point toward expanded use of laser diodes, especially as efficiency and reliability are improved, and size and operating costs of laser diodes are reduced.

FIG. 1 is a schematic view of a conventional high power laser diode assembly 100 including an array of laser diodes 110. Array 110 includes laser diodes 102 arranged in parallel (rack) and series (stack). A "rack and stack" approach enables the formation of arrays capable of generating high optical power densities (e.g., greater than 1 kW/cm$^2$). Such arrays may require relatively high voltages (typically up to a few kilovolts) and high drive currents (typically up to a few kiloamperes) to operate. Array 110 is mounted on a micro-channel cooling plate 120 to dissipate heat generated by array 110. A one-dimensional or two-dimensional array of laser diodes is referred to herein as a laser diode array (LDA).

While laser diodes have been finding new applications, the breadth of these new applications has been limited by the cost of manufacture, test, and replacement of laser diodes and laser diode arrays.

Common sources of laser diode failure arise from excessive drive currents being provided to a laser diode in an attempt to achieve high laser efficiency (where efficiency is defined as optical power output as a ratio of electrical power input). Exemplary modes of laser diode failure resulting directly or indirectly from excessive drive current include (1) dislocation of and precipitation of host atoms from the laser diode semiconductor crystal, (2) oxidation of the laser diode mirror facets, and (3) metal diffusion of the laser diode electrode and wire bonds.

Controlling the drive current of laser diodes and laser diode arrays (LDAs) to avoid excessive current is complicated by the fact that laser diode junctions are highly nonlinear, dynamic electrical loads, and output optical power can change dramatically with only a small change in input current. One example mechanism of laser diode failure resulting in the modes of failure described above is voltage breakdown of a laser diode's pn junction (also referred to herein as junction breakdown). Junction breakdown C. occurs when the drive current reaches a critical threshold, which causes strong optical absorption at a crystal defect. This in turn results in localized heating of the crystal, which causes its effective bandgap separation to shrink (and the voltage across a laser diode to decrease), giving rise to further optical absorption and increased drive current. This positive feedback process results in rapid thermal runaway, and breakdown of the pn junction.

Such voltage breakdown is illustrated graphically in FIG. 2, which shows a graphical representation of current versus time beginning with normal diode operation 210, followed by the onset of junction heating 220, during which time current increases and positive feedback begins. Ultimately catastrophic failure 230 occurs if current is not curtailed. Operation in a catastrophic failure regime can result in acute failure of a laser diode. A laser in which current has increased beyond that of normal diode operation is said to be in a "fault state."

FIG. 3 is a schematic of a conventional power driver circuit 300 having an electrical power source 320 and a semiconductor switch 360 in series with an LDA 310. The pulsing of semiconductor switch 360 is controlled by a switch trigger circuit 365. Semiconductor switches used in conventional driver circuits have included power-field effect transistors (FETs) and integrated gate bipolar transistors (IGBTs).

One drawback of conventional power driver circuits, such as circuit 300 is that the laser diodes (or LDA) powered by the circuits may be exposed to excessive current or current densities in the laser diodes. For example, while switch 360 may limit the duration of excessive current to LDA 310 to prevent catastrophic failure, LDA 310 may still be exposed to excessive current in the form of short peaks in current (i.e., transients), which occur over a period of time that is relatively short compared to the duration of pulses from switch 360 or the total current through the diode might constrict within the diode medium and produce local regions of excess current density.

Excessive current or current density may be generated by power source 320, or may be the result of changes in the operating conditions of an LDA such as constriction of the current in the laser diode medium, exposure to electromagnetic fields from other rill electric devices, electrical breakdown due to ionizing radiation from solar flares, cosmic rays or other sources of electric or magnetic interferences. Additionally, the current-voltage characteristics of an LDA itself may change over the operational lifetime of the LDA.

FIG. 4 is a graphical illustration of an exemplary current waveform 400 of a LDA driven by a conventional drive circuit. In FIG. 4, a semiconductor switch (e.g., switch 360 in FIG. 3) of the LDA driver circuit is turned on at time 410, and turned off 20 microseconds later at time 420. In exemplary waveform 400, during the 10 microsecond period 430 that follows time 420, the LDA is exposed to current transients 435. Even if junction breakdown does not occur, cumulative effect of exposure to such current transients may limit the lifetime of an LDA and cause premature failure.

To reduce the effect of transients and thereby increase the lifetime of LDAs, conventional driver circuits have been operated at reduced average currents and powers; however, reducing the current has resulted in a reduction of the optical output power available from a given LDA assembly, and has limited the applications for which a given LDA may be used.

SUMMARY OF THE INVENTION

Accordingly, there is a need for laser diodes and laser diode arrays that operate efficiently and provide adequate optical outputs over long lifetimes to reduce the costs per unit of lifetime. To that end, aspects of the present invention are directed to a driver circuit capable of providing improved transient protection to a laser diode source. Such driver circuits are capable of terminating excessive current or current density quickly in order to reduce premature laser diode failure. An additional advantage of such driver circuits is that they allow an associated laser diode source to be driven at a higher average driver current.

A first aspect of the invention is a laser diode driver circuit to generate a drive current, comprising a laser diode source to receive an amount of the drive current, an indicator device configured to receive an input signal corresponding to the amount of the drive current, and to generate an indicator signal indicative of the amount of the drive current received by the laser diode source, and a transient snubber device coupled to the indicator device to receive the indicator signal, that in response to the indicator signal is controlled to have a first impedance state during which a first amount of the drive current is provided to drive the laser diode source, and to have a second impedance state during which a second amount of the drive current is provided to drive the laser diode source, the second amount being less than the first amount.

In some embodiments of the first aspect, the second amount is substantially zero. The transient snubber device may be in parallel with the laser diode source or the transient snubber device may be in series with the laser diode source. Optionally, the transient snubber device may comprise a MOSFET transistor or a bipolar transistor.

In some embodiments, the laser driver circuit may further comprise a switch in series with the laser diode source to pulse the current provided to the laser diode source. The switch may be a GCT device.

The indicator device may be configured to receive the input signal that represents the amount of the drive current or the indicator device may be configured to receive the input signal that represents a voltage across the laser diode source. Alternatively, the indicator device may be configured to receive the input signal that represents a ratio of a voltage across the laser diode source to the drive current or the indicator device may provide the indicator signal that corresponds to a current density through the laser diode source.

In some embodiments the first aspect of the invention further comprises a prime power source coupled to the laser diode source to provide the electrical power to drive the laser diode source. The first aspect of the invention may further comprise a charging circuit coupled to the prime power source for receiving an output from the prime power source and for delivering the amount of drive current to the laser diode source. Optionally, the charging circuit may comprise a capacitive device to store a charge to deliver the amount of drive current or may comprise an inductive device to store an energy to deliver the amount of drive current.

A second aspect of the invention is a laser diode driver circuit to generate a drive current, comprising a laser diode source, a current source coupled to the laser diode source, to produce a source current, and an inductive device coupled to the current source, the inductive device storing energy corresponding to the source current, and the inductive device being coupled to the laser diode source to discharge the energy and thereby provide the drive current.

In some embodiments of the second aspect, the inductive device may comprises a first inductor in series with laser diode source, and a second inductor in parallel with the laser diodes source. In other embodiments, the driver circuit may further comprise a switch having a first state and a second state, which is coupled to the inductive device such that during the first state the inductive device stores the energy corresponding to the source current, and during a second state the inductive device discharges to provide the drive current. The switch may be a GCT.

A third aspect of the invention is a laser diode driver circuit to generate a drive current, comprising a laser diode source to receive an amount of the drive current, a means for generating an indicator signal indicative of the amount of the drive current; and a means for suppressing at least a portion of the drive current in response to the indicator signal, coupled to the means for generating an indicator signal, that in response to the indicator signal is controlled to have a first impedance state during which a first amount of the drive current is provided to drive the laser diode source, and to have a second impedance state during which a second amount of the drive current is provided to drive the laser diode source, the second amount being less than the first amount. The second amount is substantially zero.

In some embodiments, the means for suppressing is in parallel with the laser diode source. Alternatively, the means for suppressing may be in series with the laser diode source. Optionally, the means for suppressing may comprise a MOSFET transistor or a bipolar transistor.

Some embodiments of the third aspect of the invention further comprise a switching means in series with the laser diode source to pulse the current provided to the laser diode source. The switching means comprises a GCT device.

The means for generating the indicator signal may comprise a means for receiving an input which is representative of the amount of the drive current. Alternatively, the means for generating the indicator signal may comprise a means for receiving an input which is representative of the amount of a voltage across the laser diode source. The means for generating an indicator signal may be configured to receive the input signal that represents a ratio of a voltage across the laser diode source to the drive current.

The driver circuit may further comprise a prime power source coupled to the laser diode driver circuit to provide the electrical power to drive the laser diode source. The driver circuit may further comprise a charging circuit for storing the electrical power and for delivering the amount of drive current to the laser diode source. The charging circuit may comprise a capacitive device to store a charge to deliver the amount of drive current or may comprise an inductive device to store the electrical power to deliver the amount of current.

A fourth aspect of the invention is a method of driving a laser diode source with an amount of current, comprising generating a drive current, providing an amount of the drive current to the laser diode source, generating an indicator signal indicative of the amount of the drive current, and reducing the amount of the drive current provided to the laser diode source in response to the indicator signal indicating that the drive current exceeds a threshold.

In some embodiments, the act of reducing comprises shunting at least a portion of the current away from the laser diode source. Alternatively, the act of reducing comprises blocking at least a portion of the current from reaching the laser diode source. The method of driving may further comprise pulsing the drive current.

The act of generating the indicator signal may comprise receiving an input which is representative of the amount of the drive current or may comprise receiving an input which is representative of a voltage across the laser diode source.

DETAILED DESCRIPTION

Figure 5:
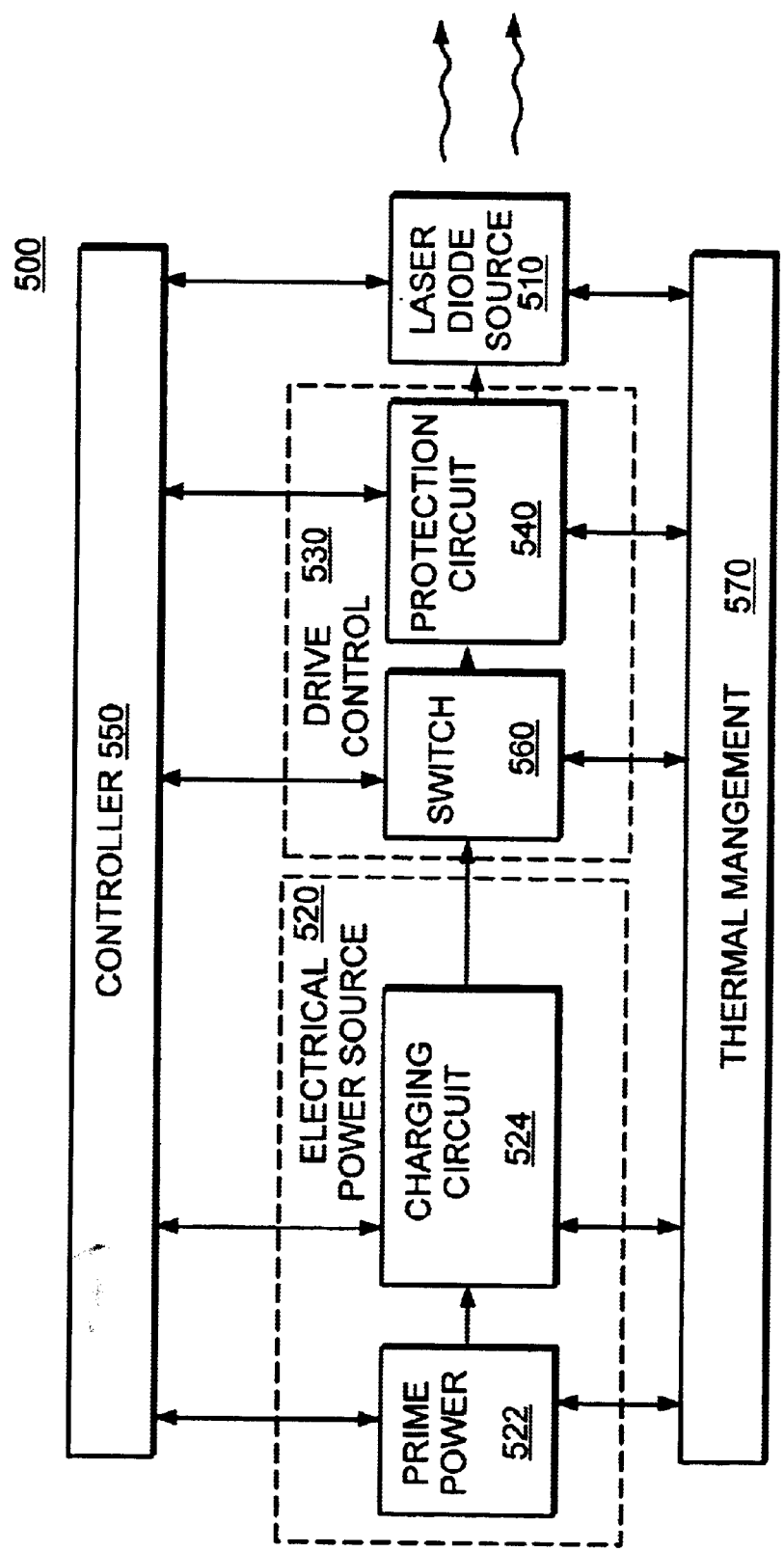
FIG. 5 is a functional block diagram of a laser diode driver circuit according to at least some aspects of the invention.

FIG. 5 is a functional block diagram of a laser diode power driver circuit 500 according to at least some aspects of the invention. In FIG. 5, a laser diode source 510 is powered by an electrical power source 520 which generates power to drive laser diode source 510, and a driver control 530 controls the portion of the power generated by electrical power source 520 that drives laser diode optical source 510.

Laser diode optical source 510 may be any laser diode source. For example, source 510 may be a single laser diode, a plurality of laser diodes connected in series or parallel, or may be a rack and stack laser diode array.

Electrical power source 520 may be comprised of any electrical power source capable of generating electrical power sufficient to operate source 510. Preferably, source 520 is capable of generating a substantially uniform current, but it is to be understood that power source 520 may provide current having spikes or other deviations.

For example, source 520 may include a prime power source 522 such as a battery, an AC or DC voltage source, an alternator or any other suitable electrical power source known to one of ordinary skill in the art. As described in greater detail below, source 520 may also have a charging circuit 524 including one or more capacitors or inductors to store charge or energy, and to achieve and maintain a current output to drive laser diode source 510 upon discharge. For example, the charging circuit maybe a capacitive device comprising one or more capacitors that store charge for each pulse of current to drive laser diode source 510. Alternatively, the charging circuit may be an inductive device comprising one or more inductors that store energy corresponding to at least the current for each pulse of current. The charging circuit may include a resistive element to determine the charging time of charging circuit 524 and may be any charging circuit known to one of ordinary skill in the art for this purpose.

Drive control 530 may include a switch 560 that pulses the signal output from the power source 520 to provide pulsed power to laser diode source 510. Switch 560 may be used to control the pulse frequency and pulse duration of the current provided to laser diode source 510; for example, if laser diode source 510 is used as an optical pump, switch 560 may be used to provide current pulses to generate optical output from laser diode source 510 at a rate suitable for energizing an active medium (not shown). Switch 560 can be any switch capable of switching a current and voltage signal. In some embodiments, switch 560 is capable of high-speed switching of high current and high voltage signals. For example, switch 560 may be an IGBT or a FET. In some embodiments, switch 560 is a gate commutated thyristor (GCT), available from ABB Semiconductor Ltd. of Lensburg, Switzerland. GCTs are discussed in greater detail below with reference to FIG. 6.

Drive control 530 may comprise protection circuit 540 to protect laser diode source 510 from being overdriven by excessive current (e.g., current transients) or current densities arising from constriction of the current in the laser diode. As described in greater detail below, in some embodiments, protection circuit 540 comprises a transient snubber device located in parallel with laser diode optical source 510, which is capable of being selectively activated from a high impedance state to a low impedance state in response to a signal indicating that a threshold has been attained. The threshold can be a current threshold, e.g., a threshold indicative of excessive current to the laser diode 510, or a voltage threshold, e.g., the voltage across the laser diode source. For example, the signal may be generated by an indicator (e.g., a comparator); and the threshold may correspond to a current through laser diode source 510, or a voltage across laser diode source 510 indicating the current through the laser diode source is excessive. Alternatively, the signal might be derived from a measurement of both voltage across the laser diode source and the current through the laser diode source, for example, a ratio of the voltage to current to determine variations in impedance.

In embodiments where protection circuit 540 comprises a snubber device located in parallel with laser diode optical circuit 510, the snubber is configured such that when the snubber is operating in a high impedance state, substantially all of the current is directed to the laser diode source 510, and when snubber is operating in a low impedance, substantially all of current is directed through the snubber and away from laser diode source 510. Preferably, for these embodiments, the snubber includes a high speed switch capable of being switched from the high impedance state to the low impedance state in a short interval of time. For example, the snubber may be a high-speed switching transistor, such as a MOSFET, or a bipolar transistor.

Alternatively, in some embodiments, protection circuit 540 comprises a transient snubber device located in series with laser diode optical source 510, which is capable of being selectively activated from a low impedance state to a high impedance state in response to a signal indicating that a threshold has been attained. In such embodiments, when the snubber device is operating in a low impedance state, substantially all of the current is directed to the laser diode source 510, and when snubber device is operating in a high impedance state, the current is prohibited from reaching the laser diode source 510. Preferably, for these embodiments, the snubber circuit comprises a high speed switch capable of being switched from a low impedance state to a high impedance state in a short interval of time. For example, the snubber may be a high-speed switching transistor, such as a MOSFET or a bipolar transistor.

Circuit 500 may also include a thermal management system 570 to control the operating temperature of any of the components comprising circuit 500. Thermal management system 570 may be any combination of pipes, heat sinks, valves or other plumbing known for use with laser diode systems.

Circuit 500 may also include a controller 550 to control a threshold of fault protection circuit 540 or to maintain fault protection circuit 540 in a selected impedance state for a selected period of time, for example, irrespective of the state of the laser diode source 510, thus allowing source 510 to recover from heating due to operation in a fault state.

Controller 550 may also control switch 560 to selectively control the pulse frequency and pulse duration of the power provided to laser diode source 510. Controller 550 may also may also obtain information to determine the strength of the optical output power from laser diode source 510, and use the information to control electrical power output from prime power source 522. In addition, controller 550 may receive a signal indicating an operating temperature of any of the components comprising circuit 500, and control thermal management system 570 to reduce or increase a temperature accordingly.

Figure 6:
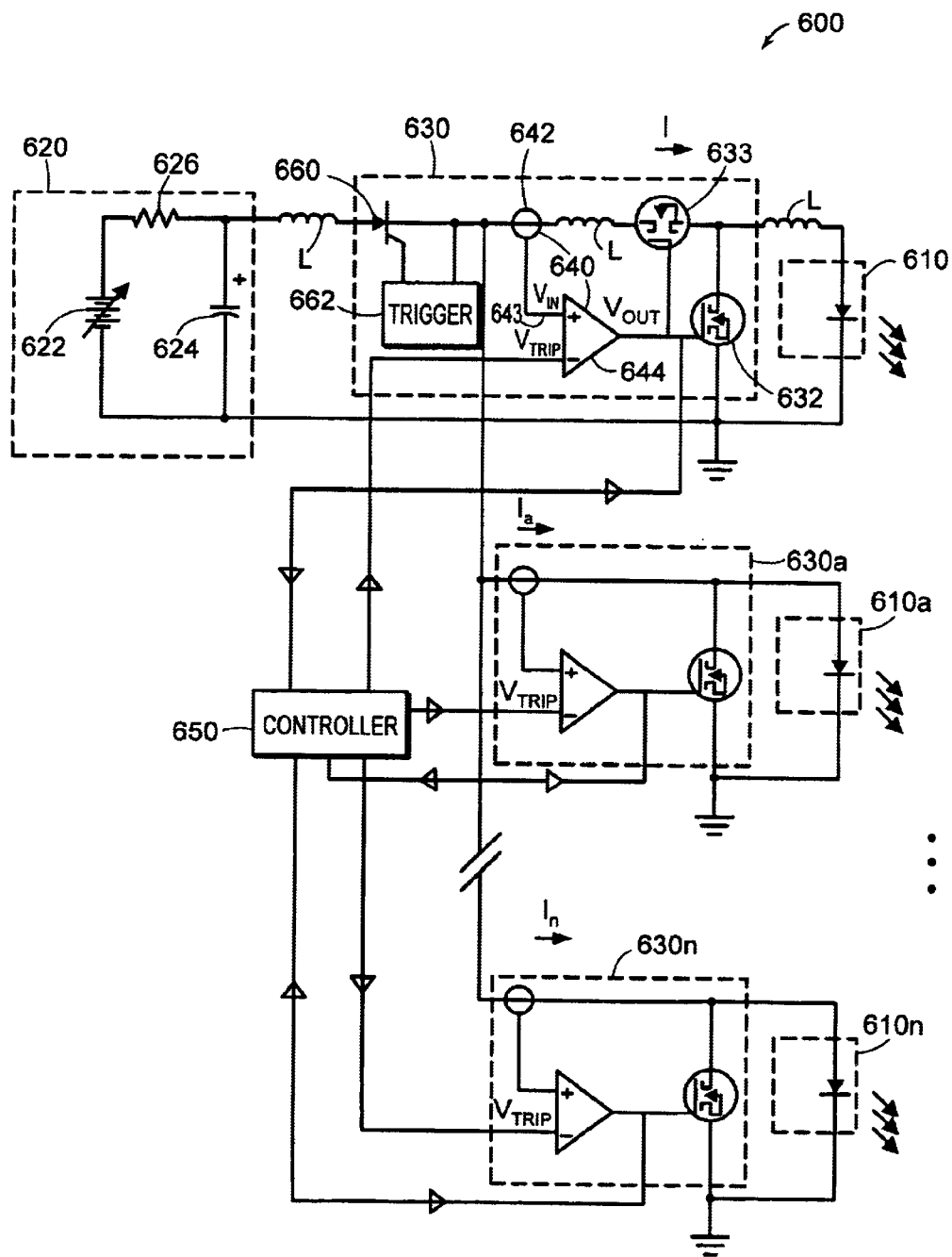
FIG. 6 is a schematic of an embodiment of a laser diode driver circuit according to at least some aspects of the invention.

FIG. 6 is a schematic of one example of an embodiment of a laser diode driver circuit 600 according to at least some aspects of the invention. Driver circuit 600 provides a current I to a laser diode source 610. In some embodiments, laser diode source 610 is a laser diode array (e.g., a rack and stack laser diode array) comprising diode sources 10, 10a, . . . 10n. For example, the laser diode source 610 may be an InGaAs array, such those manufactured by Coherent Inc., of Santa Clara, Calif., or Osram-Dilas, of Mainz, Germany. It is to be appreciated that, although the laser diode source is illustrated as a diode array, as stated above, laser diode source 610 may be any single laser diode or any laser diode array having a plurality of laser diodes assembled in series and/or parallel. In some cases, as described below, control circuitry and/or fault sensing circuitry may be applied to each laser diode array in a laser diode array.

Circuit 600 has an electrical power source 620 that includes a prime power source 622, and a storage capacitor 624. Capacitor 624 stores charge from prime power source 622 to provide a selected current I to laser diode source 610 upon discharge. Driver circuits such as circuit 600 that use a voltage source to charge a capacitive element are commonly referred to as voltage-fed driver circuits.

Capacitor 624 is selected to have a capacitance large enough to drive laser diode source 610 with current I during each pulse. In some embodiments, capacitor 624 may store a charge that is approximately ten times larger than called for by the laser diode source to deliver current I to help ensure current stability. Although capacitor 624 is illustrated as a single capacitor, one of ordinary skill in the art would understand that one or more capacitors may comprise capacitor 624. A resistor 626 in combination with capacitor 624 may be used to control a time period during which capacitor 624 charges, and to filter current I to help reduce high frequency fluctuations of the current I supplied to laser diode assembly 610. Preferably, power source 620 is impedance-matched to the remainder of circuit 600, for example, to help avoid the generation of transients in current I provided to source 610.

Circuit 600 also comprises a drive control device 630 including a switch 660 that controls the pulsing of the current I to laser diode source 610. A trigger 662 controls a pulse frequency and duration of the pulse of current I by controlling switch 660. It is to be understood that switch 660 can be any switch capable of high-speed switching of high current and high voltage signals. For example, switch 660 may be a conventional laser diode driver circuit switch such as an IGBT or a FET. According to some embodiments, switch 660 is a gate commutated thyristor (GCT).

A GCT is a pnpn semiconductor structure having an anode, a cathode and a gate. Compared to conventional laser diode switches, GCTs have faster turn-on and turn-off rates that can reach, for example, 5 kilovolts/microsecond, thus allowing improved control of the laser diode source pulse width. For example, turn-off of current through the anode of a conventional GCT can occur approximately 5 microseconds after application of a negative voltage to a gate of the GCT; additionally, improvements in turn-off time of the GCT to 1 microsecond can be achieved by gold-doping of the semiconductor substrate of the GCT. GCT-type switching devices have a high specific power density rating, which may provide advantages where a compact, light-weight driver circuit is preferred.

Drive control device 630 may include a snubber device 632 that is in parallel with laser diode source 610 and/or a snubber device 633 that is series with laser diode source 610. Snubber device 632 is capable of being selectively activated from a high impedance state to a low impedance state in response to a signal indicating that current I flowing to source 610 is too large or exceeds a preset threshold. When snubber device 632 is operating in a high impedance state, snubber device 632 is configured to allow substantially all of current I to be directed to laser diode source 610, and when snubber device 632 is operating in a low impedance state, substantially all of current I is directed through snubber device 632 to ground, an is shunted away from the laser diode source 610. Preferably, snubber device 632 is a high speed switch capable of being switched from high impedance state to a low impedance state in a short interval of time. Although snubber device 632 is illustrated as a single device, one or more similarly configured devices may be operated in series to obtain a preferred current or voltage capacity.

Snubber device 633 should also be capable of being selectively activated from a low impedance state to a high impedance state in response to a signal indicating that current I flowing to laser diode source 610 is excessive. When snubber device 633 is operating in a low impedance state, snubber device 633 is configured to allow substantially all of current I to be directed laser diode source 610, and when snubber device 633 is operating in a high impedance state, circuit 600 provides an open circuit and current I is prohibited from reaching laser diode source 610. Preferably, snubber device 633 is a high speed switch capable of being switched from low impedance state to a high impedance state in a short interval of time (e.g., less than approximately 100 nanoseconds). Although snubber device 633 is illustrated as a single device, one or more similarly configured devices may be operated in series to obtain a preferred current or voltage capacity.

For example, snubber devices 632 and/or 633 may be a high-speed switching transistor, such as a MOSFET, or a bipolar transistor. For reasons discussed in greater detail below, in some embodiments, snubber devices 632 and 633 are selected to be devices have package sizes T0202 or smaller, or are selected to be surface mount devices to achieve a small circuit topology.

Circuit 600 also comprises a current indicator device 640 that generates an output signal indicative of the current passing to laser diode source 610 and, in particular, indicating that current I has exceeded a threshold. For example current indicator device 640 may be comprised of a transformer 642 coupled to an input of a comparator 644 to generate a voltage indicative of the current I flowing to laser diode assembly 610. Transformer 642 generates a signal $V_{in}$ at input 643 of comparator 644 which is indicative of current I, and provides $V_{in}$ to the input of the comparator 644. Comparator 644 can be configure with a threshold $V_{trip}$, such that when the threshold level $V_{trip}$ has been exceeded by $V_{in}$, a signal $V_{out}$ is generated at the current indicator device output. When current I exceeds a threshold, comparator 644 provides a signal to snubber device 632 and/or snubber device 633 which are configured to provide low impedances and high impedances as described above.

In addition to selecting snubber device 632 to be a high speed switching device, it may be preferable to select a circuit topology for driving circuit 6100 that allows for a fast switching speed. Because the conductive elements used to electrically couple snubber device 632 to each of the components of circuit 600 have a parasitic inductance L, an important consideration in achieving a high switching speed for snubber device to 632 is selecting low inductance conducting elements to couple the components of circuit 600, and locating the components in close proximity to each other so as to reduce the length of any conductive elements. For example, the conductive elements may be low inductance wire, cable or strip line.

Figure 1:
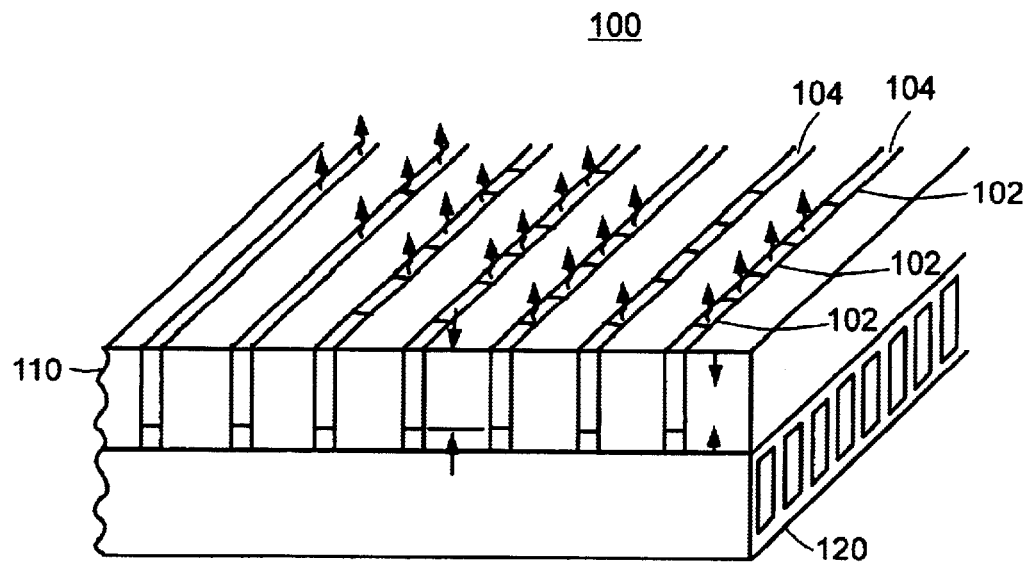
FIG. 1 is a schematic view of a conventional high power laser diode assembly (LDA)
Figure 2:
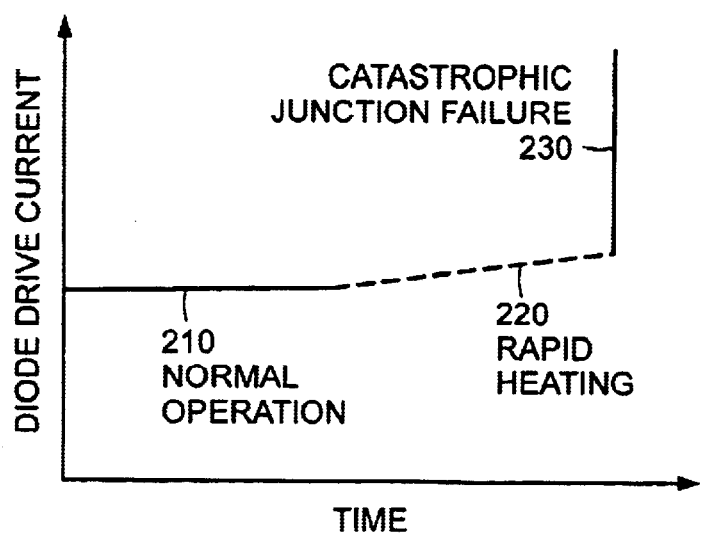
FIG. 2 is a graph of drive current versus time illustrating junction breakdown of an LDA.
Figure 3:
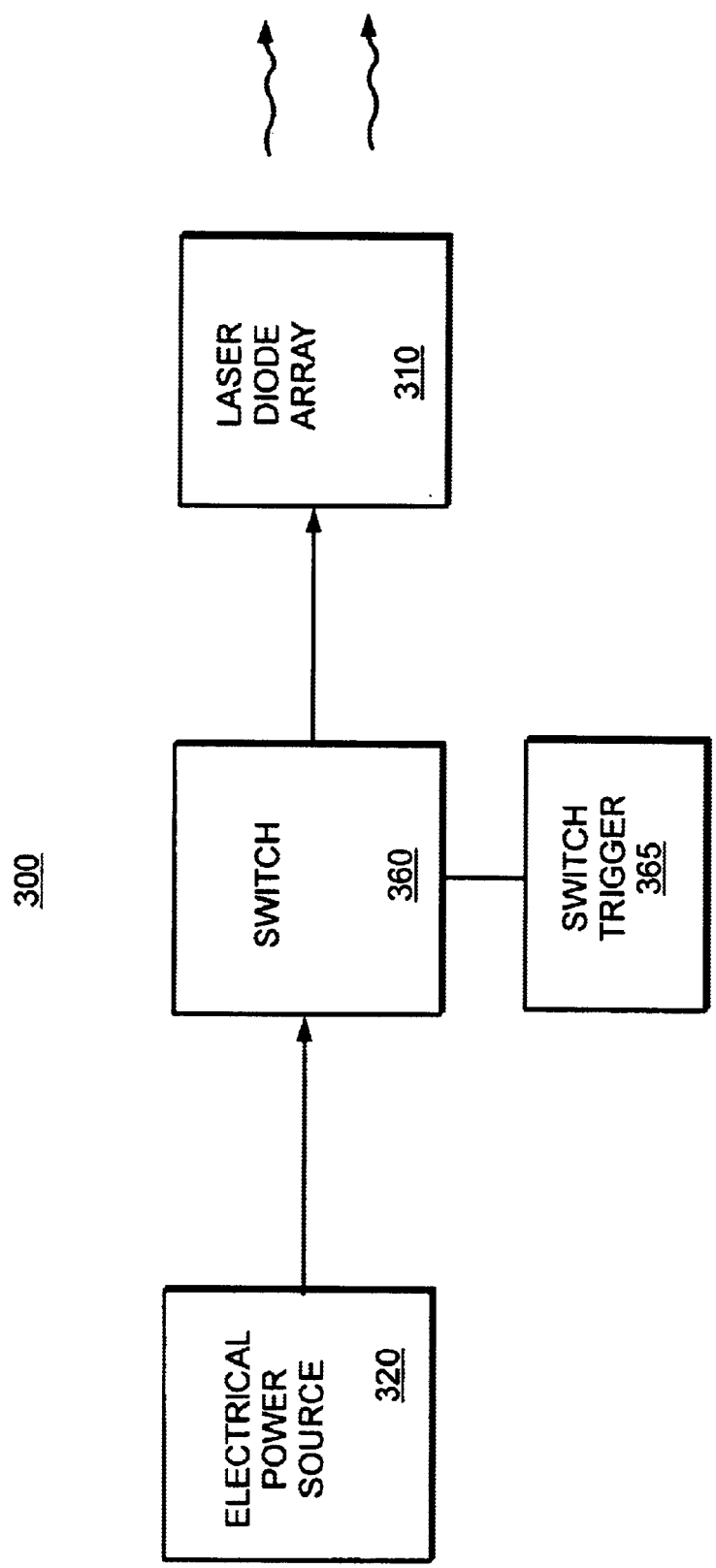
FIG. 3 is a schematic of a conventional laser diode driver circuit.

In some integrated embodiments, the conductive elements are selected to be low inductance strip line and the distance between electronic devices is less than approximately a few inches, such that the inductance coupled to snubber device 632 is less than approximately 20 nH, to provide a switching speed of less than 100 nanoseconds. In some embodiments, snubber device 632 is integrated on the same cooling plate (e.g., cooling plate 120, visible in FIG. 1) as the laser diode to reduce the lengths of strip line on a circuit board, or any other low-inductance path known to one of ordinary skill in the art.

Optionally, a controller 650 may be added to maintain snubber device 632 in a low impedance state, and/or snubber device 633 in a high impedance state for a predetermined period of time, irrespective of the state of the laser diode source 610. For example, upon receiving signal $V_{out}$ from comparator 640 indicating that the current I has exceeded a pre-selected threshold, controller 650 can provide an output to snubber device 632 to maintain snubber device 632 in a low impedance state for a selected period of time (independent of when laser diode source 610 has recovered) thus diverting current I to provide sufficient time for allow source 610 to recover from excessive current I.

The selected time is a function of the source 610 and the ability of the source 610 to dissipate heat associated with excessive current. For example, the signal $V_{out}$ indicating that the threshold has been exceeded can be wired to an interrupt of controller 650, such that upon receiving an interrupt signal, controller 650 sets $V_{trip}$ to a low voltage (approximately zero volts) for a selected time interval. In some embodiments, controller 650 can be configured such that if an interrupt corresponding to a given laser diode source is received a selected number of times over a selected time interval, controller 650 provides an indication that laser diode source is defective.

Additionally, controller 650 may be coupled to comparator 644 to provide voltage $V_{trip}$ to comparator 644. Accordingly, controller 650 can be configured to control the current threshold, and controller 650 can thus be configured to control the maximum current that reaches laser diode source 610.

According to some embodiments, source 610 may comprise one or more additional sources 610a–n coupled to electrical power source 620. Each additional source 610a–n can have an associated drive control device 630a–n to determine whether associated current Ia–n has reached a corresponding selected threshold level. It is to be appreciated that each of the additional sources 610a–n may be the same as 610 or different, and drive control circuits 640a–n may be similarly configured to drive control 640 or different (e.g., they may have one or more snubber devices in parallel or series with a laser diode source, and may have the same or different current thresholds). Upon a determination that a current I, Ia–n has been reached for a respective laser diode source 610, 610a–n, the current I, Ia–n corresponding to the given laser diode source 610, 610a–n is prevented from driving the respective laser diode source, and the remainder of the sources 610, 610a–n remain unaffected.

Figure 4:
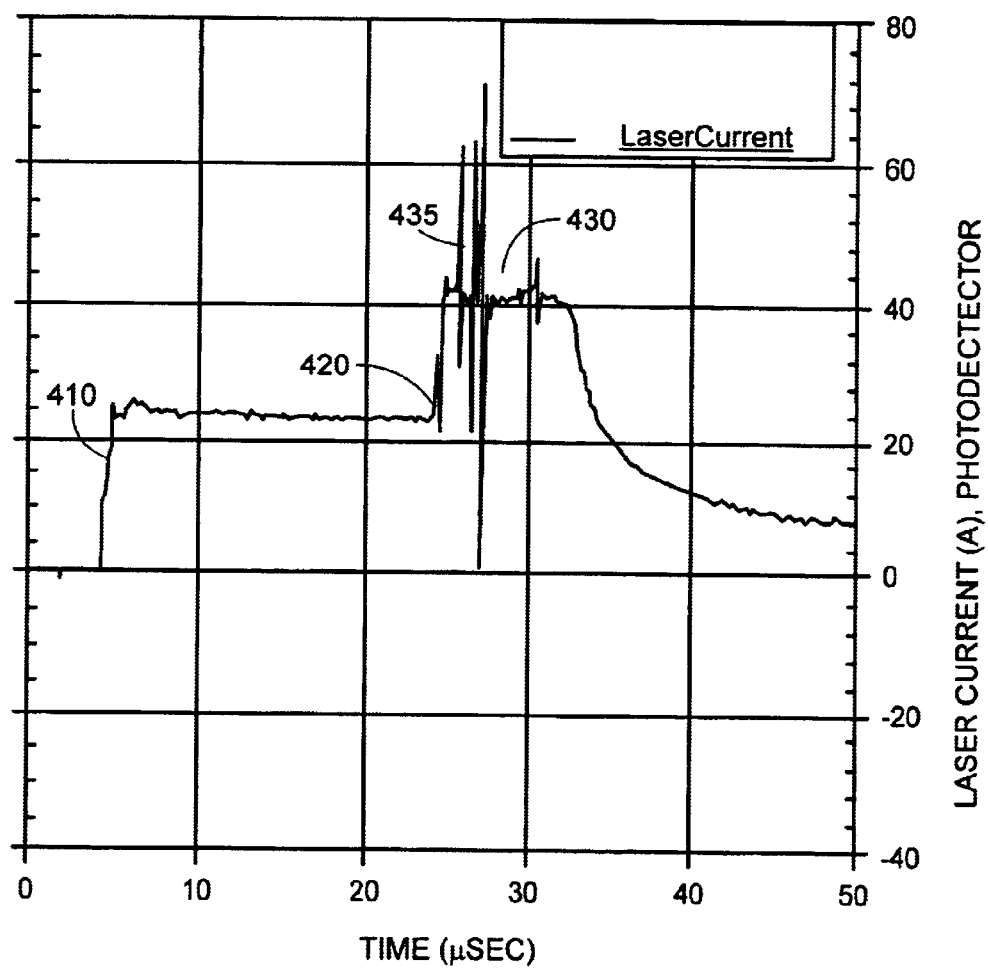
FIG. 4 is a graphical illustration of an exemplary current waveform of a LDA driven by a conventional drive circuit.
Figure 7:
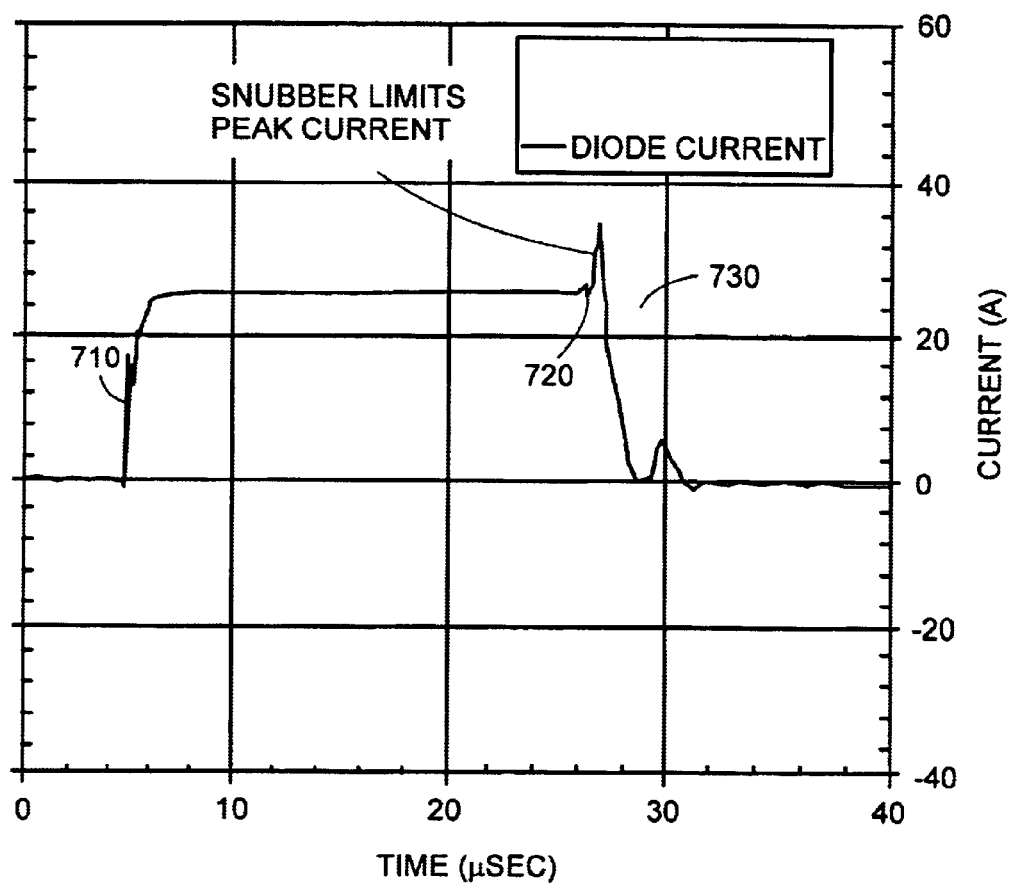
FIG. 7 is a graphical illustration of an exemplary current waveform of a LDA driven by a drive circuit according to at least some aspects of the invention.

FIG. 7 is a graphical illustration of an exemplary current waveform of a LDA driven by a drive circuit according to some aspects of the invention. In FIG. 7, semiconductor switch 660 (visible in FIG. 6) is turned on at 710, and turned off 20 microseconds later at 720. It can be see in FIG. 7 and is to be appreciated that during the period 730 that follows the turn off of semiconductor switch 760, the extreme swings present in the conventional driver circuit illustrated in FIG. 4 above, are avoided, thus reducing the damage to the laser diode source and providing an increase in laser diode source lifetime relative to an source powered by a conventional driver circuit.

Figure 8:
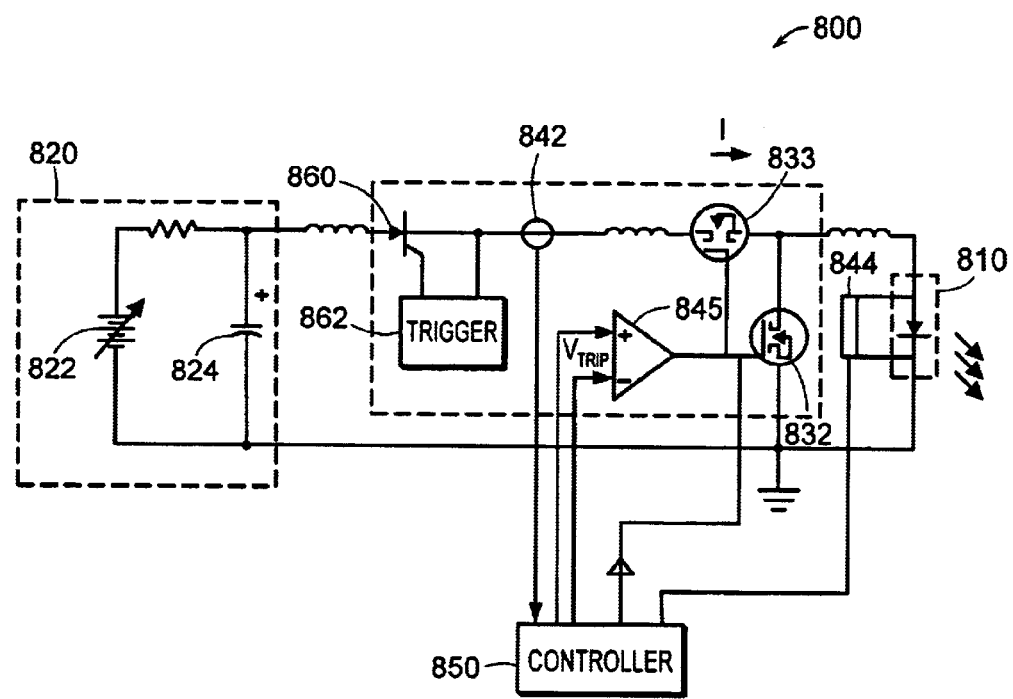
FIG. 8 is a schematic of another embodiment of a laser diode power driver circuit to drive a laser diode source.

FIG. 8 is a schematic of another embodiment of a laser diode power driver circuit 800 to drive a laser diode source 810. Circuit 800 provides a current I to laser diode source 810, and includes a snubber device 832 and/or snubber device 833 each having an impedance controlled according to the impedance of laser diode source 810. For example, a change in impedance of laser diode source 810 may be indicative of a laser diode fault, such as excessive current density.

Circuit 800 includes an electrical power source 820 that provides a signal to power laser diode source 810. The electrical power source includes a prime power source 822 and a charging circuit 824. Although charging circuit 824 is illustrated as being a capacitive circuit, it is to be appreciated that charging circuit may alternatively be an inductive circuit as described below with reference to FIG. 9 or any other charging circuit suitable for this application as known to one of ordinary skill in the art. Circuit 800 may include a switch 860 controlled by a trigger 862 to provide pulsed power to laser diode source 810.

Snubber device 832 is in parallel with laser diode source 810 and snubber device 833 is in series with laser diode source 810. Snubber device 832 is capable of being selectively activated from a high impedance state to a low impedance state in response to a signal indicating impedance of laser diode source 810. When snubber device 832 is operating in a high impedance state, snubber device 832 is configured to allow substantially all of current I to be directed to laser diode source 810, and when snubber device 832 is operating in a low impedance state, substantially all of current I is directed through snubber device 832 to ground, an is shunted away from the laser diode source 810.

Snubber device 833 is also capable of being selectively activated from a low impedance state to a high impedance state in response to a signal indicating impedance of laser diode source 810. When snubber device 833 is operating in a low impedance state, snubber device 833 is configured to allow substantially all of current I to be directed laser diode source 810, and when snubber device 833 is operating in a high impedance state, circuit 800 provides an open circuit and current I is prohibited from reaching laser diode source 810.

A controller 850 receives an input indicative of current provided to laser diode source 810, and an input indicative of a voltage across laser diode source 810, and selectively generates a control signal for snubber device 832 and/or a control signal for snubber device 833. The input indicative of current may be from any known device 842 for determining current. For example, current indicator device 842 may be comprised of a transformer to generate a voltage indicative of the current I flowing to laser diode assembly 810. The input indicative of the voltage across laser diode source 810 may be from any known device 844 for measuring voltage. For example, device 844 may be an amplifier having known amplification.

Controller 850 determines a quantity indicative of impedance of laser diode source by calculating a ratio of the input indicative of voltage across the laser diode and the input indicative of current through the laser diode. The impedance of snubber device 832 and snubber device 832 are controlled in response to the quantity indicative of impedance of the laser diode source 810. It is to be appreciated that the impedance of snubber device 832 and/or snubber device 832 may be selected to reduce current I due to an increase in impedance, a decrease in impedance, or a selected change in impedance of laser diode source 810. For example, the change in impedance may be a change over a selected period of time or a change from a baseline value. It is also to be appreciated that control of impedance of snubber device 832 and/or snubber device 832 based on impedance of laser diode source may be used in addition to control based on laser diode drive current as described above with reference to FIG. 6.

Optionally the quantity indicative of the impedance of the laser diode source 810 can be provided to an input of a comparator 845. The comparator can have a selected threshold $V_{trip}$. The output of comparator can be used to control the impedances of snubber device 832 and snubber device 833.

Figure 9:
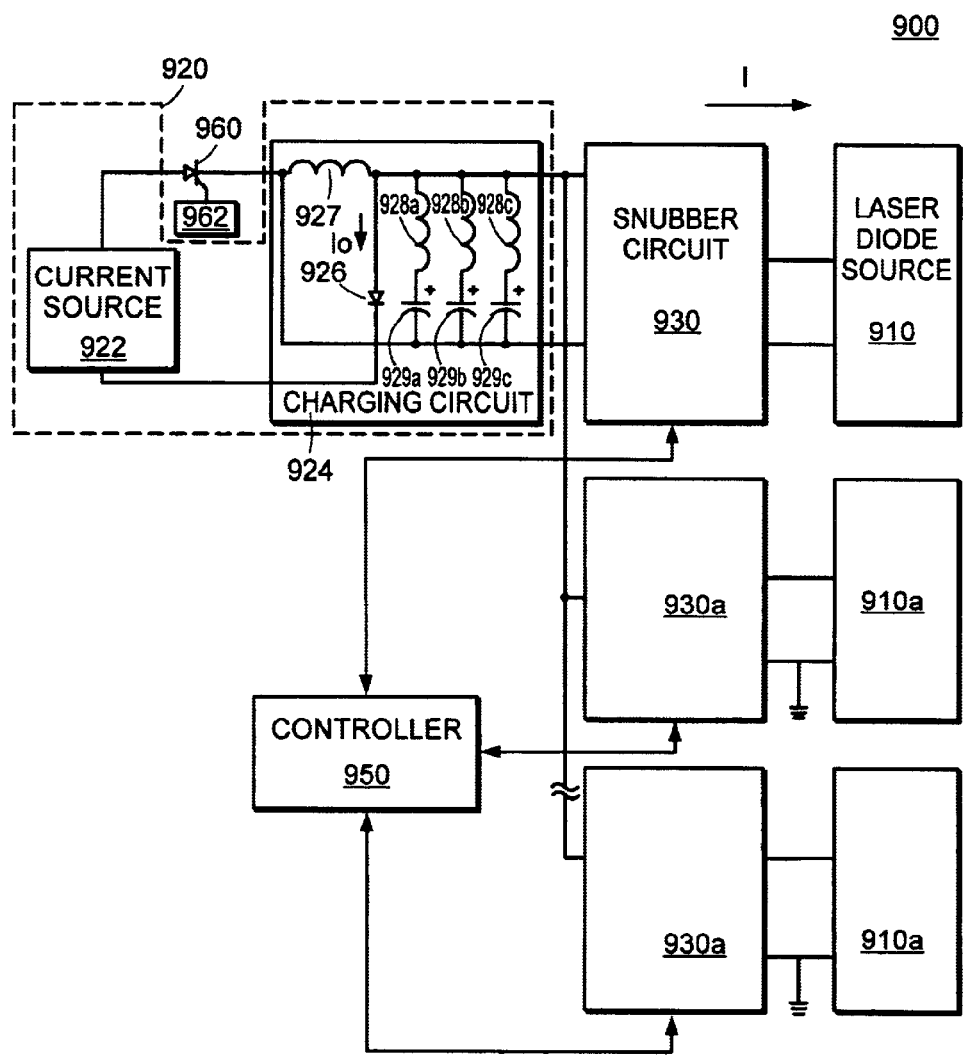
FIG. 9 is a schematic of another embodiment of a laser diode driver circuit according to at least some aspects of the invention.

FIG. 9 is a schematic of an example of embodiment of a laser diode power driver circuit 900 having an inductive charging circuit according to some aspects of the invention. Driver circuit 900 provides a current I to a laser diode source 910. A snubber circuit 930, as described above, may be included to protect the laser diode source 910 from excessive current.

The circuit also comprises a power source 920 comprising a switch 960 that is operated to achieve pulsing of power from source 922 to laser diode source 910. Switch 960 can be any switch capable of switching a current and voltage signal. In some embodiments switch 510 is a high-speed switch capable of switching high currents and high voltage signals. For example, switch 960 may be a gate commutated thyristor (GCT), as described above.

Circuit 900 also has a charging circuit 924. Charging circuit 924 stores energy corresponding to a current from prime source 922. Charging circuit 924 is selected to have an inductance large enough to store energy desired to provide a selected current I though laser diode source 910, and in some embodiments is approximately ten times larger than called for by the laser diode source 910 to help ensure current stability. Driver circuits, such as circuit 900, that use a current source to charge an inductive element are commonly referred to as current-fed driver circuits.

Charging circuit 924 is comprised of a charging diode 926 and an inductor 927 and one or more inductors 928a, 928b, and 928c. One or more capacitors 929a, 929b, and 929c may be added, to shape the shape the waveform of the current directed to laser diode source 910 according to known methods of circuit design. Preferably, power source 920 is impedance matched to the remainder of circuit 900, for example, to prevent the generation of transients.

During a charging phase of charging circuit 924, switch 960 is in a conductive state and current $I_o$ from power source 922 is directed through charging diode 926. During a discharge phase, switch 960 is switched off and the energy stored in charging circuit 924 is discharged to generate a current in laser diode source 910 otherwise the circuit of FIG. 9 operates as described above with respect to FIG. 6.

Figure 10:
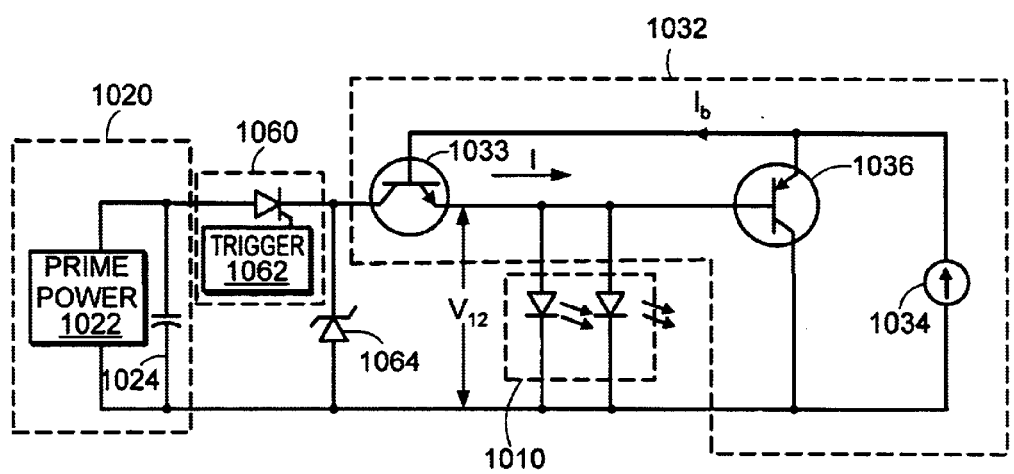
FIG. 10 is a schematic of another embodiment of a laser diode driver circuit according to at least some aspects of the invention.

FIG. 10 is a schematic of another embodiment of a laser diode power driver circuit 1000 to drive a laser diode source 1010. Circuit 1000 provides a current I to laser diode source 1010, and includes a snubber circuit 1032 including a switch 1033 that is controlled to provide an impedance dependent on a voltage $V_{ld}$ across laser diode source 1010.

Circuit 1000 includes an electrical power source 1020 that provides a signal to power laser diode source 1010. The electrical power source includes a prime power source 1022 and a charging circuit 1024. Although charging circuit 1024 is illustrated as being a capacitive circuit, it is to be appreciated that charging circuit may alternatively be an inductive circuit as described above with reference to FIG. 9 above or any other charging circuit suitable for this application as known to one of ordinary skill in the art. Circuit 1000 may includes a switch 1060 controlled by a trigger 1062 to provide pulsed power to laser diode source 1010. Optionally an avalanche photodiode 1064 may also be included to limit voltage the voltage output of power source 1020.

Switch 1032 is in series with laser diode source 1010 and has a low impedance state during which current I directed to laser diode source 1010, and a high impedance state during which current I is reduced (or prevented from reaching laser diode source 1010). The bias current is thus provided to switch 1060 from a current source 1034. Current source 1034 may be any current source capable of generating a bias current to maintain switch 1033 in a conductive mode. The amount of current to be provided to switch 1033 determines the impedance of snubber circuit 1032, and thus the drive current delivered to laser diode source 1010.

In the absence of an excessive current I, switch 1032 is controlled to provide current from power source 1020 to laser diode source 1010. Switch 1032 may be any device having a conductivity that increases in response to an increase current input. For example, switch 1032 may be a transistor. In one embodiment, switch 1032 is a RF bipolar transistor capable of switching rates of 150 MHz.

A comparator 1036 is configured to monitor the voltage $V_{ld}$ across laser diode source 1010. As described below, comparator 1036 becomes conductive in the event that $V_{ld}$ drops below a threshold voltage. Comparator 1036 may be any device having a conductivity dependent on a voltage input. For example, comparator 1036 may be a transistor. In one embodiment, comparator 1036 is a bipolar transistor having a switching rate of 1000 MHz. Although comparator 1036 is illustrated as a single device, it is to be understood that comparator 1036 may, in some embodiments, be combination of devices such as a operational amplifier in combination with a transistor, where the operational amplifier monitors voltage $V_{ld}$ and produces an output to the transistor, which becomes conductive upon receiving the operational amplifier output.

As discussed above, when laser diode source 1010 is operating in a fault state, the voltage $V_{ld}$ across laser diode source 1010 decreases. In response to a drop in voltage $V_{ld}$, comparator 1036 becomes conductive and diverts a portion of bias current $I_b$. Accordingly, the impedance of switching transistor 1033 increases, and the current I directed to laser diode source 1010 is reduced, thus removing laser diode source 1010 from a fault state. The reduction in provided to laser diode source 1010 allows the source 1010 to recover (i.e., dissipate heat and return to a non-fault state).

As the recovery occurs, the voltage across source 1010 is increased and the amount of bias current $I_b$ diverted by comparator 1036 is reduced. Accordingly, the conductivity of switch transistor 1032 is increased, and the portion of the current transmitted by switch transistor 1032 is increased.

Although the illustrated embodiment driver circuit includes a switch in series with laser diode source, with its impedance increasing in response to decrease in voltage $V_{ld}$ across laser diode source 1010, it is to be appreciated that alternative embodiments can be provided and are intended to be within the scope of this disclosure. For example, in one alternative embodiment a switch is located in parallel with laser diode source 1010, such that impedance decreases in response to decrease in voltage $V_{ld}$ across laser diode source 1010.

Having thus described the inventive concepts and a number of exemplary embodiments, it will be apparent to those skilled in the art that the invention may be implemented in various ways, and that modifications and improvements will readily occur to such persons. Thus, the examples given are not intended to be limiting. The invention is limited only as required by the following claims and equivalents thereto. Also, it is to be understood that the use of the terms "including," "comprising," or "having" is meant to encompass the items listed thereafter and equivalents thereof as well as additional items before, after, or in-between the items listed.

What is claimed is:

1. A laser diode driver circuit comprising:
   a laser diode source configured and arranged to receive current from a power source;
   an indicator device configured and arranged to monitor an operational parameter of the laser diode source to determine whether a characteristic of the current provided to the laser diode source has exceeded a threshold, and to generate an indicator signal indicative of whether the characteristic of the current provided to the laser diode source has exceeded the threshold; and
   a transient snubber device, coupled to the laser diode source, having at least first, second and third terminals, the first terminal being coupled to the indicator device to receive the indicator signal therefrom, the transient snubber device being configured and arranged such that, in response to the indicator signal provided on the first terminal indicating that the characteristic of the current has exceeded the threshold, an impedance between the second and third terminals is altered so that the transient snubber device is caused to limit the current that is provided to the laser diode source.

2. The circuit of claim 1, wherein the transient snubber device is in parallel with the laser diode source.

3. The circuit of claim 1, wherein the transient snubber device is in series with the laser diode source.

4. The circuit of claim 1, wherein the transient snubber device comprises a MOSFET transistor.

5. The circuit of claim 1, wherein the transient snubber device comprises a bipolar transistor.

6. The circuit of claim 1, further comprising a switch in series with the laser diode source to pulse the current provided to the laser diode source.

7. The circuit of claim 6, wherein the switch comprises a GCT device.

8. The circuit of claim 1, wherein the indicator device is configured and arranged to receive an input signal that represents an amount of current being provided to the laser diode source, and to monitor the characteristic of the current being provided to the laser diode source based thereupon.

9. The circuit of claim 1, wherein the indicator device is configured and arranged to receive an input signal that represents a voltage across the laser diode source, and to monitor the characteristic of the current being provided to the laser diode source based thereupon.

10. The circuit of claim 1, further comprising the power source, wherein the power source comprises a prime power source coupled to the laser diode source to provide electrical power to drive the laser diode source.

11. The circuit of claim 10, wherein the power source further comprises a charging circuit coupled to the prime power source for receiving an output from the prime power source and for delivering the amount of drive current to the laser diode source.

12. The circuit of claim 11, wherein the charging circuit comprises a capacitive device to store a charge to deliver the amount of drive current.

13. The circuit of claim 11, wherein the charging circuit comprises an inductive device to store an energy to deliver the amount of drive current.

14. A laser diode driver circuit comprising:
    a laser diode source configured and arranged to receive a drive current from a power source;
    means for monitoring a characteristic of the drive current and generating an indicator signal having a state that changes in response to chances in the monitored characteristic of the drive current; and
    means, responsive to the state of the indicator signal, for selectively suppressing at least a portion of the drive current when the indicator signal is in a particular state.

15. The circuit of claim 14, wherein the means for suppressing is in parallel with the laser diode source.

16. The circuit of claim 14, wherein the means for suppressing is in series with the laser diode source.

17. The circuit of claim 14, wherein the means for suppressing comprises a MOSFET transistor.

18. The circuit of claim 14, wherein the means for suppressing comprises a bipolar transistor.

19. The circuit of claim 14, further comprising a switch in series with the laser diode source to pulse the current provided to the laser diode source.

20. The circuit of claim 19, wherein the switch comprises a GCT device.

21. The circuit of claim 14, further comprising the power source, wherein the power source comprises a prime power source coupled to the laser diode driver circuit to provide electrical power to drive the laser diode source.

22. The circuit of claim 21, wherein the power source further comprises a charging circuit for storing the electrical power and for delivering the drive current to the laser diode source.

23. The circuit of claim 22, wherein the charging circuit comprises a capacitive device to store a charge to deliver the drive current to the laser diode source.

24. The circuit of claim 22, wherein the charging circuit comprises an inductive device to store the electrical power to deliver the drive current to the laser diode source.

25. A method of driving a laser diode source, comprising:
    generating a drive current;
    providing an amount of the drive current to the laser diode source;

generating an indicator signal indicative of a monitored characteristic of the drive current; and providing the indicator signal to a first terminal of a transient snubber device that is coupled to the laser diode source, and has at least first, second and third terminals, the transient snubber device being and being configured and arranged such that, in response to the indicator signal indicating that the monitored characteristic of the drive current has exceeded a threshold, an impedance between the second and third terminals of the transient snubber device is altered so as to reduce the amount of the drive current provided to the laser diode source.

26. The method of claim 25, wherein the transient snubber device is configured and arranged to shunt at least a portion of the current away from the laser diode source in response to the indicator signal indicating that the monitored characteristic of the drive current has exceeded the threshold.

27. The method of claim 25, the transient snubber device is configured and arranged to block at least a portion of the current from reaching the laser diode source in response to the indicator signal indicating that the monitored characteristic of the drive current has exceeded the threshold.

28. The method of claim 25, further comprising pulsing the drive current.

29. The method of claim 25, wherein the act of generating the indicator signal comprises receiving an input which is representative of the amount of the drive current.

30. The method of claim 25, wherein the act of generating the indicator signal comprises receiving an input which is representative of a voltage across the laser diode source.

* * * * *